United States Patent [19] [11] Patent Number: 4,885,603
Tomizawa et al. [45] Date of Patent: Dec. 5, 1989

[54] IMAGE RECORDING APPARATUS FOR PRODUCING GLOSSY IMAGE MEDIUM

[75] Inventors: Takashi Tomizawa, Aichi; Osamu Takagi, Nagoya, both of Japan

[73] Assignee: Brother Kogyo Kabushiki Kaisha, Aichi, Japan

[21] Appl. No.: 172,800

[22] Filed: Mar. 28, 1988

[30] Foreign Application Priority Data

Apr. 2, 1987 [JP] Japan ................ 62-5035[U]

[51] Int. Cl.⁴ .............................. G03B 27/52
[52] U.S. Cl. ....................... 355/30; 355/27; 355/106
[58] Field of Search ............ 355/27, 106, 3 FU, 30

[56] References Cited

U.S. PATENT DOCUMENTS 3,452,181 6/1969 Stryjewski .............. 355/3 FU
4,341,458 7/1982 Glass et al. ............. 355/3 FU
4,416,966 11/1983 Sanders et al. .
4,554,235 11/1985 Adair et al. .
4,562,137 12/1985 Sanders .

FOREIGN PATENT DOCUMENTS 2133899A 1/1984 United Kingdom .

Primary Examiner—Monroe H. Hayes
Attorney, Agent, or Firm—Oliff & Berridge

[57] ABSTRACT

The heating device and the feeding device of an image medium which are provided in an image recording apparatus in order to furnish the image medium with glosses are made movable with each other by a contacting mechanism. Normally, the heating device and the feeding device are separated so that unnecessary heat transfer from the heating device to the feeding device is avoided, whereby the heating capacity of the heating device is minimized and no cooling mechanism for the feeding device is needed. When the image medium comes, the two devices are contacted to pinch and directly heat the image medium therebetween, whereby a beautiful gloss surface is obtained.

6 Claims, 1 Drawing Sheet

IMAGE RECORDING APPARATUS FOR PRODUCING GLOSSY IMAGE MEDIUM

BACKGROUND OF THE INVENTION

This invention relates to an image recording apparatus, particularly to that for producing a glossy surface of the image recorded medium.

An image recording apparatus for producing a glossy surface using an appropriate image medium is already known. For example, U.S. patent application Ser. No. 07/112,217 "Image Forming Process and System, Including Heating Step or Device for Increased Density of Images" (filed on Oct. 26, 1987) bearing the same assignee as in this application discloses one of that kind. This apparatus includes an image recording section in which a desired image is recorded on an image medium and a glossing section in which the image recorded medium is furnished with glosses. In the glossing section, a heating device and a feeding device are provided: the heating device is contacted on the surface of the image recorded medium to heat the medium and furnish it with glosses; and the feeding device together with the heating device, with the medium therebetween, presses and feeds the medium.

In the prior art image recording apparatus, the heating device and the feeding device are always contacted with each other. Therefore, as the heat of the heating device escapes to the feeding device, the heating device therefore must generate an unnecessary amount of heat to maintain temperature necessary to gloss the medium. This problem further causes secondary problems to arise as follows. The greater heat capacity of the heating device increases cost. As the feeding device is always heated, the parts of the feeding device need heat resistance, which restricts the material of the parts and, in some cases, necessitates a heat insulation or a cooling mechanism. This further increases the cost.

SUMMARY OF THE INVENTION

An object of the invention is to obviate the problems of the prior art image recording apparatus and to provide a glossing section with less heat capacity and requiring no heat resistant material at the feeding device.

According to the invention, the image recording apparatus comprises an image recording section and a glossing section for furnishing an image medium with glosses by means of heat, the glossing section comprising: a heating device for heating the image medium; a feeding device for feeding the image medium; and a contacting means for enabling the heating device and the feeding device to come in contact with each other.

When the image medium records an image at the recording section and not in the glossing section, the contacting means is operated to separate the heating device and the feeding device. This much reduces the heat transfer from the heating device to the feeding device. Therefore, the necessary heat generation of the heating device is reduced and the parts of the feeding device need not be made of expensive heat resistant material. Another advantage is that insulation or a cooling mechanism is not required for the feeding device, which further reduces the cost. When the recorded image medium comes to the glossing section, the contact means makes the heating device and the feeding device come in contact with each other. The image medium is heated by the heating device and is furnished with a glossy surface. The feeding device is pressed to the heating device with the image medium therebetween and feeds the image medium at an appropriate speed to give the medium necessary heat to gloss the surface.

BRIEF EXPLANATION OF THE DRAWINGS

The invention may be best understood by referring to the following description of the preferred embodiment and the drawings in which.

DETAILED DESCRIPTION OF THE PREFERRED EMBODIMENTS

Figure 1:
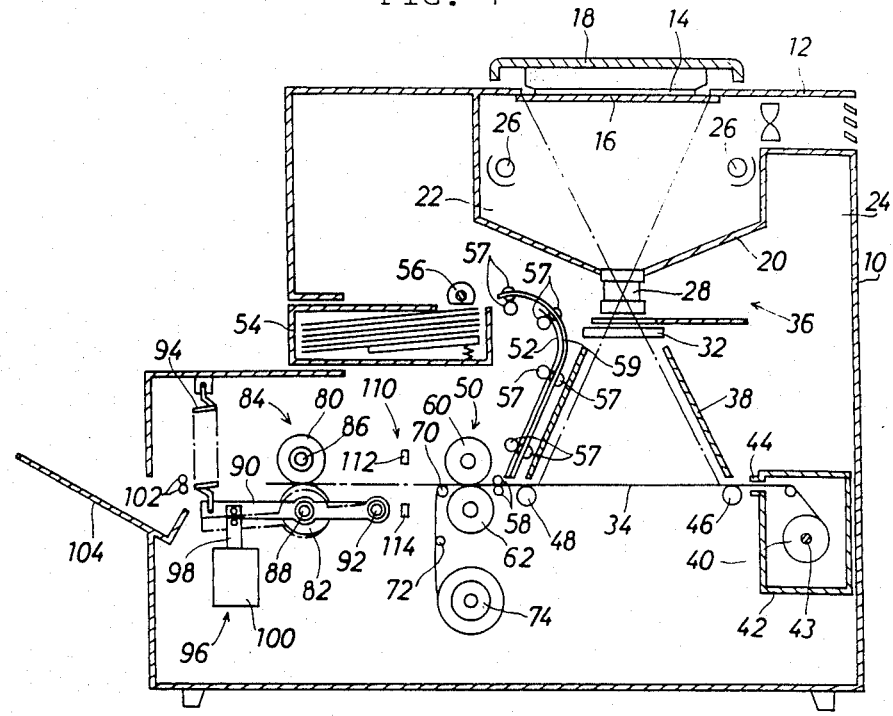
FIG. 1 is a cross sectional view of an image recording apparatus as the first embodiment of the invention.

As shown in FIG. 1, an image recording apparatus is constructed in a housing box 10. At the top 12 of the housing box 10, a transparent plate 16 is provided on which an original copy 14 is placed for copying. The original copy 14 is covered by a cover 18 when copying. Under the transparent plate 16, an exposure room 22 is formed by a separating wall 20 which divides the inside of the housing box into the exposure room 22 and a dark room 24. A pair of lights 26 are provided at both sides of the exposure room 22 and a lens 28 is provided at the bottom of the exposure room 22. The light from both lights 26 is cast on the original copy 14 via the transparent plate 16 and the reflected light is focused by the lens 28 on a photo-pressure sensitive paper 34 placed under the lens 28, producing a latent image corresponding to the image on the original copy 14 on the photo-pressure sensitive paper 34. A shutter 32 is provided under the lens 28 to allow the reflected light for a predetermined period and a shield plate 38 is provided in the dark room 24 to prevent unnecessary light from exposing the photo-pressure sensitive paper 34. The separating wall 20, the lights 26 and the lens 28 construct an exposure part 36 of the image recording apparatus.

The photo-pressure sensitive paper 34 is coated by microcapsules containing photo-curable resin, colorless chromogenic material and polymerization initiator. This paper is a so-called transfer type and thus the microcapsules do not contain developer. The photo-pressure sensitive paper 34 is fed from a roll 40 which is sustained on an axis 43 in a casing 42. The photo-pressure sensitive paper 34 is drawn out of the casing 42 through an aperture 44 and placed under the lens 28 by a pair of rollers 46 and 48. At the downstream of the exposure part 36, a developing part 50 is provided. Developing papers 52 are stacked in a cassette 54 placed over the developing part 50. The developing part 52 is coated by a developing agent with polyvinylalcohol as the binding agent. A developing paper 52 is taken out of the cassette by a take-out roller 56 and placed on the photo-pressure sensitive paper 34 via a plurality of feed rollers 57, a guide plate 59 and a pair of rollers 58. The stacked photo-pressure sensitive paper 34 and the developing paper 52 are fed to the developing part 50.

A pair of pressure rollers 60, 62 are provided in the developing part 50. One of the rollers 60 is driven by a motor (not shown) and the other roller 62 is pressed to the roller 60 by an urging mechanism (not shown). The photo-pressure sensitive paper 34 and the developing paper 52 are pressed between the rollers 60, 62 and the latent image on the photo-pressure sensitive paper 34 is developed on the developing paper 52. The exposure part 36 and the developing part 50 constitute the image recording section.

After being pressed and driven by the rollers 60, 62, the photo-pressure sensitive paper 34 is guided by rollers 70, 72 to a reel 74. The reel 74 is driven by the motor of the roller 60 via a friction clutch and takes up the photo-pressure sensitive paper 34 at the same speed with the rollers 60, 62.

The developing paper 52 is separated from the photo-pressure sensitive paper 34 after the pressure rollers 60, 62 and is fed to a glossing part 84. In the glossing part 84, a heating roller 80 as the heating device and a feed roller 82 as the feeding device are provided. The heater of the heating roller 80 is a halogen lamp. The heating roller 80 is supported by an axis 86 fixed to the housing box 10 and is driven by the motor of the pressure roller 60. The feed roller 82 is supported by another axis 88 which is supported by a pair of amps 90 (only one of which is shown in FIG. 1). These arms 90 are placed in parallel to the feeding direction of the developing paper 52 and pivotally fixed to the housing box 10 at one end 92, whereby the heating roller 80 and the feed roller 82 can be in contact or apart.

The other free ends of the arms 90 are urged upward by springs 94 and also at the free end of one of the arms 90 a plunger 98 of a solenoid 96 is attached. When the solenoid 96 is not energized, the springs 94 urge the feed roller 82 upward to come in contact with the heating roller 80, as shown by the solid line in FIG. 1. When the solenoid 96 is energized, the plunger 98 is pulled downward into a casing 100 of the solenoid 96 and the feed roller 82 is separated from the heating roller 80, as shown by the chain line in FIG. 1. The arms 90, spring 94, solenoid 96, plunger 98 etc. constitute the contacting means of the invention.

The surface temperature of the heating roller 80 is maintained at an appropriate value, e.g. 130° to 150° C., sufficient for the glossing of the image recorded developing paper 52. The feed roller 82 is designed to have such a heat capacity that the surface temperature does not exceeds 75° C. after the heat transfer from the heating roller 80 during the contacting period. This design in temperature limit prevents a transfer of the recorded image from the developing paper 52 to the feed roller 82.

At the downstream side of the glossing part 84, a pair of feed rollers 102 are provided to feed out the developing paper 52 on a tray 104. These feed rollers 102 are also driven by the motor of the pressure roller 60 and the peripheral speed of the rollers 58, 80, 102 are set equal.

Between the developing part 50 and the glossing part 84 and after the photo-pressure sensitive paper 34 is separated from the developing paper 52, a paper sensor 110 is provided, including a light emitter 112 and a light receiver 114. When the developing paper 52 begins to pass between the light emitter 112 and the light receiver 114, a start signal is sent to a control device (not shown) and when the paper 52 finishes passing, an end signal is sent. The control device de-energizes the solenoid 96 responsive to the start signal to make a contact between the heating roller 80 and the feed roller 82 and again energizes the solenoid 96 at a preset period after the end signal is received. This period is determined based on the feed speed of the developing paper 52 to travel from the paper sensor 110 to the heating roller 82.

In the above structured image recording apparatus, the solenoid 96 is normally energized and the heating roller 80 and the feed roller 82 are separated. After an exposure of an image at the exposure part 36 is finished and the image is developed on the developing paper 52 at the developing part 50, the developing paper 52 passes the paper sensor 110 to generate the start signal and the end signal. According to the start signal, the feed roller 82 is contacted to the heating roller 80 and the developing paper 52 passes between the rollers 80, 82, whereby the developing paper 52 is heated. The developed image is fixed by the heat and the developing agent and the polyvinylalcohol melt or soften also by the heat to produce glossy appearance of the surface of the developing paper 52. After the developing paper 52 passes the rollers 80, 82, the solenoid 96 is again energized to separate the feed roller 82 from the heating roller 80.

As described above, in this embodiment, the feed roller 82 is contacted to the heating roller 80 only when necessary but is separated normally. Therefore less heat generation at the heating roller 80 is required. Further, as the surface temperature of the feed roller 82 is maintained not to exceed 75° C., the image on the developing paper 52 is not transferred to the feed roller 82, which keeps the feed roller 82 clean and produces a beautiful glossy image.

As the image transfer from the developing paper 52 to the feed roller 82 is prevented, the developing paper 52 can be pinched between the two rollers 80, 82 and directly heated by the heating roller 80. Therefore, less time is required to heat the developing paper 52 than when it is heated indirectly in a heating chamber and crinkles on the surface of the developing paper 52 are avoided.

Figure 2:
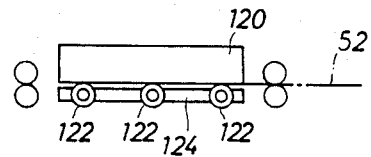
FIG. 2 is a side view of a glossing section of another embodiment.

Another embodiment of the glossing part 84 different from the rollers 80, 82 of the above embodiment is now explained with reference to FIG. 2. The heating device is composed of a heater plate 120 and the feeding device is composed of a plurality of feed rollers 122. The plural feed rollers 122 are placed in parallel to the heater plate 120 and are supported by a supporting member 124. The supporting member 124 is driven by a contacting mechanism (not shown) to rise and fall in order to contact and separate the heater plate 120 and the feed rollers 122. In this embodiment, as in the previous embodiment, the supporting member 124 is elevated by the contacting mechanism and the developing paper 52 is pinched between the heater plate 120 and the feed rollers 122 when the start signal is generated at the paper sensor 110. After the developing paper 52 is heated by the heater plate 120 and passes the heater plate 120, the feed rollers 122 are separated from the heater plate 120 by the contacting mechanism.

In the above two embodiments, the feeding device is exemplified by feed rollers 82, 122, but other feeding devices such as a belt can be employed.

The coming of the developing paper 52 is detected by the paper sensor 110 in the preceding embodiments to control the contacting timing of the heating device and the feeding device. Another method for controlling the contacting timing is to utilize the rotating amount of the motor of the pressing roller 60 which is proportional to the traveling distance of the developing paper 52.

The feed roller 82, 122 can be equipped with a cooling mechanism to ensure that the surface temperature is below 75° C. In this case, though, the capacity of the cooling mechanism can be reduced compared to the case when the feed roller 82, 122 is always contacting the heating roller 80 or the heater plate 120. The heating capacity of the heating roller 80 or the heater plate 120 is also reduced.

In the above embodiments, the contacting mechanism is provided for the feeding device (feed roller 82, 122). Alternatively, the contacting mechanism may be provided for the heating device (heating roller 80, heater plate 120) or for both the feeding device and the heating device.

The contacting mechanism is exemplified by the combination of springs 94 and a solenoid 96 in the above embodiment. A combination of a motor and a cam or a hydraulic actuator cylinder can be employed as the contacting mechanism instead.

The image making process of the above embodiment is exemplified by the use of image transfer type photo-pressure sensitive medium. Naturally, the self-developing type photo-pressure sensitive medium can be employed in the above embodiment. Further, such type of image medium may be employed that a photo-sensitive resin in the microcapsules coated on the medium surface is softened by the exposure of light and the image is developed by pressing the microcapsules with a pressure roller.

Obviously many modifications and variations of the present invention are possible in light of the above teachings. It is therefore to be understood that within the scope of the appended claims, the invention may be practiced other than as specifically described.

What is claimed is:

1. An image recording apparatus comprising an image recording section and a glossing section for furnishing an image medium with glosses by means of heat, the glossing section comprising:

a heating device for heating the image medium;
    a feeding device for feeding the image medium;
    a contacting means for urging one of the heating device and the feeding device against the other and for separating one from the other; and
    an arm for supporting the urged and separated device;
    wherein the contacting means is provided at one end of the arm so that the contacting means applies force to one end of the arm while the other end serves as a point of support; and
    wherein the urged and separated device is mounted between the two ends of the arm.

2. An image recording apparatus according to claim 1, wherein the image recording apparatus further comprises a medium sensor for sensing the medium and the contacting means makes the heating device and the feeding device come in contact with each other according to a signal from the medium sensor.

3. An image recording apparatus according to claim 1, wherein the contacting means makes the heating roller and the feeding roller come in contact with each other according to a rotating amount of the feeding roller.

4. An image recording apparatus according to claim 1, wherein:

the heating device is a plate provided with a heater; and
    the feeding device is a plurality of rollers placed in parallel to the plate.

5. An image recording apparatus according to claim 1, wherein the contacting means is a spring and a solenoid.

6. An image recording apparatus according to claim 1, wherein the feeding device directly comes in contact with one surface of the image medium on which images are recorded.

* * * * *